(12) United States Patent
Yin et al.

(10) Patent No.: US 6,984,284 B2
(45) Date of Patent: Jan. 10, 2006

(54) PIEZOELECTRIC COMPOSITES AND METHODS FOR MANUFACTURING SAME

(75) Inventors: Jainhua Yin, Scarborough (CA); Francis Stuart Foster, Toronto (CA); Katarzyna Anna Harasiewicz, Thornhill (CA)

(73) Assignee: Sunnybrook and Women's College Health Sciences Centre, Toronto (CA)

( * ) Notice: Subject to any disclaimer, the term of this patent is extended or adjusted under 35 U.S.C. 154(b) by 152 days.

(21) Appl. No.: 10/726,805

(22) Filed: Dec. 3, 2003

(65) Prior Publication Data

US 2004/0227429 A1 Nov. 18, 2004

Related U.S. Application Data

(60) Provisional application No. 60/470,235, filed on May 14, 2003.

(51) Int. Cl.
*B32B 31/18* (2006.01)
*H04R 17/00* (2006.01)
*H01G 7/00* (2006.01)

(52) U.S. Cl. .............. 156/263; 156/250; 156/256; 156/257; 156/268; 310/311

(58) Field of Classification Search .............. 156/250, 156/256, 257, 263, 267, 268; 310/311; 29/25.35, 29/25.41
See application file for complete search history.

(56) References Cited

U.S. PATENT DOCUMENTS

| | | | |
|---|---|---|---|
| 4,412,148 A | 10/1983 | Klicker et al. | 310/358 |
| 4,658,176 A * | 4/1987 | Nakaya et al. | 310/334 |
| 5,239,736 A * | 8/1993 | Sliwa et al. | 29/25.35 |
| 5,539,965 A * | 7/1996 | Safari et al. | 29/25.35 |
| 5,615,466 A | 4/1997 | Safari et al. | 29/25.35 |
| 5,758,398 A | 6/1998 | Rijnbeek et al. | 29/25.42 |
| 6,088,894 A | 7/2000 | Oakley et al. | 29/25.35 |
| 6,183,578 B1 * | 2/2001 | Ritter et al. | 156/89.12 |
| 6,489,706 B2 | 12/2002 | Sliwa, Jr. et al. | 310/334 |
| 6,629,341 B2 | 10/2003 | Wilkie et al. | 29/25.35 |

FOREIGN PATENT DOCUMENTS

| | | |
|---|---|---|
| EP | 0602261 | 6/1994 |
| JP | 06038297 | 4/1994 |

OTHER PUBLICATIONS

Article entitled "Interdigital Pair Bonding for High Frequency (20-50 MHz) Ultrasonic Composite Transducers" by Ruibin Liu, Kasia A. Harasiewicz and F. Stuart Foster, Printed in the IEEE Transaction on Ultrasonics, Ferroelectrics, and Frequency Control, vol. 48, No. 1, Jan. 2001.

(Continued)

*Primary Examiner*—Melvin Mayes
(74) *Attorney, Agent, or Firm*—Needle & Rosenberg, PC

(57) ABSTRACT

A method is described for making a composite, such as a piezoelectric composite, having a predetermined volume ratio. Initially, a pair of base slabs are diced to form slot having uniform pitch spacing such that a material portion of one diced base slab may be received within the slots of another diced base slab. The diced base slabs are interdigitated and joined to form a first piezoelectric composite that can subsequently be diced to form slots having a uniform pitch spacing that are spaced from the first slots. Two diced first piezoelectric composites are interdigitated and joined to form a second piezoelectric composite of reduced volume ratio and finer pitch.

16 Claims, 6 Drawing Sheets

OTHER PUBLICATIONS

Article entitled "2-2 Piezoelectric Composites with High Density and Fine Sale Fabricated by Interdigital Pair Bonding" by Ruibin Liu, Kasia A. Harasiewicz, D. Knapik, N.A. Freeman and F. Stuart Foster, Printed in the Applied Physics Letters, vol. 75, No. 21, Nov. 22, 1999.

Article entitled "Fabrication of 2-2 Piezoelectric Composites by Interdigital Pair Bonding" by Ruibin Liu, Donald Knapik, Kasia A. Harasiewicz and F. Stuart Foster, Printed in the 1999 IEEE Ultrasonic Symposium, 1999.

* cited by examiner

PIEZOELECTRIC COMPOSITES AND METHODS FOR MANUFACTURING SAME

This application claims priority to and the benefit of U.S. Provisional Application No. 60/470,235, entitled "Methods of Manufacturing Piezoelectric Composites for Ultrasound Applications and Such Composites," filed on May 14, 2003, which is incorporated in its entirety in this document by reference.

BACKGROUND OF THE INVENTION

1. Field of the Invention

This invention relates to piezoelectric composites, and more particularly to piezoelectric composites for high-frequency ultrasound applications and methods of manufacturing such composites.

2. Background Art

Typically, high quality medical imaging uses ultrasonic transducers or transducer arrays that posse the properties of good sensitivity and wide frequency bandwidth. Conventional transducers utilizing monolithic piezoelectric material such as, for example, lead zirconate titanate ("PZT"), typically exhibit a large acoustic impedance mismatch between the transducer and the medium under test, such as, for example, water, human tissue, and the like. To overcome this problem, piezoelectric composites that are made of individual small piezoelectric elements surrounded and isolated by a polymer matrix, such as, for example, epoxy, have been proposed. These proposed small piezoelectric elements play an increasingly important role in the development of ultrasonic transducers for medical imaging. The most commonly used structures of piezoelectric composite consist of small strips or posts of PZT that are embedded in a host matrix of polymer material. The height of the strips or posts is normally about one half wavelength at the operating frequency.

The conventional process for the fabrication of a piezoelectric composite, the "dice and fill" method, begins with a monolithic slab of piezoelectric material. Slots, or kerfs, are cut into the slab using a dicing saw. The slots are then filled in with host material such as epoxy. A two-dimensional piezoelectric composite which consists of posts and host matrix is made by cutting the piezoelectric slab in two orthogonal directions.

The volume ratio, which is the ratio of ceramic volume over the whole composite and is usually equal to the ratio of ceramic width to pitch size in the cases of conventional 1-3 and 2-2 composites, affects characteristics of the piezoelectric composite such as coupling coefficient, velocity, acoustic impedance, and the like. Thus, changing the volume ratio allows for the customization of the particular piezoelectric composite for the desired transducer application/design. Unfortunately, in the conventional "dice and fill" process, the slot/kerf size is determined by the thickness of the saw blade. It is difficult to make a specific volume ratio composite when the pitch size needs to be fixed. Normally, the volume ratio is changed by using blades of different thickness, but the volume ratio is still limited by the thickness of the blades that can be chosen, particularly when the slots/kerfs to be cut are of fine dimensions.

SUMMARY

In one aspect, the present invention provides a practical method for the fabrication of composites/arrays at any volume ratio and especially, the fabrication of uniform fine scale composites/arrays for high frequency applications.

According to one aspect of the present invention, a piezoelectric composite/array is formed at any arbitrary volume ratio by a shift cutting method. A first piece and second piece of a piezoelectric base slab is provided. Initially, the upper surface of each piezoelectric base slab is cut to form an array of parallel male ridges that are spaced by an array of parallel slots. The width and depth of each slot is predetermined. The first and second base slabs are then interdigitated and joined together. Because the width of each ridge is less that the width of each slot, a first gap is formed that may be filled with a polymeric material when the base slabs are interdigitated. An uncut portion of one of the base slabs is removed to form a first interdigitated piezoelectric composite slab.

Subsequently, in a shift-dicing step, each first interdigitated piezoelectric composite slab is cut using the same pitch and slot size as the cut that was made on the original piezoelectric base slab. The cutting position in this shift-dicing step is shifted in a width-wise dimension by a distance equal to a portion of the ridge width. The remaining second ridges will consist of both piezoelectric material and polymeric fill material with a certain ratio which is determined by the shift distance of the cutting operation. Two such first interdigitated piezoelectric composite slabs are formed and then interdigitated by positioning them face to face and inserting the second ridges of one first interdigitated piezoelectric composite slab into the second slots of the other first interdigitated piezoelectric composite slab. Because the width of each second ridge is less that the width of each second slot, a second gap is formed that may be filled with a polymeric material when the first interdigitated piezoelectric composite slabs are interdigitated. The uncut portions on one or both sides of interdigitated slab may be removed by grinding or lapping. A uniform composite/array with any volume ratio can be made through above described process.

The invention disclosed herein presents a practical and easy way to produce such piezoelectric composite/array with arbitrary volume ratio for both low and high frequency applications.

BRIEF DESCRIPTION OF THE DRAWINGS

These and other features of the preferred embodiments of the invention will become more apparent in the following detailed description in which reference is made to the appended drawings wherein.

DETAILED DESCRIPTION OF THE INVENTION

Figure 1A:
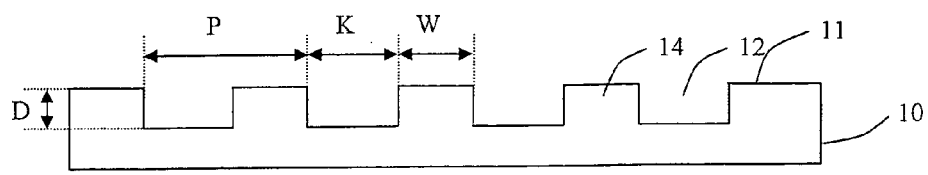
FIG. 1A is a vertical section of one base piezoelectric slab diced in accordance with an embodiment of the present invention.

The present invention is more particularly described in the following exemplary embodiments that are intended as illustrative only since numerous modifications and variations therein will be apparent to those skilled in the art. As used herein, "a," "an," or "the" can mean one or more, depending upon the context in which it is used. The preferred embodiments are now described with reference to the figures, in which like reference characters indicate like parts throughout the several views.

The present method for manufacturing piezoelectric composites allows the operator to readily select and manufacture a piezoelectric composite that has a predetermined desired volume ratio, which is the ratio of the volume of piezoelectric material in the piezoelectric composite to the whole volume of the composite. The present invention uses shift cutting with a conventional cutting element of a predetermined width.

In one aspect of the present invention, a shift cutting and multi-interdigitating process provides a practical and easy way to produce piezoelectric composites and related acoustic devices that have kerf widths as thin as several microns and pitch sizes below 30 microns. The method also allows one to fabricating an extremely fine pitch by using reliable, stiff and relatively thick cutting elements. For example, it is possible to create a 20 $\mu$m pitch composite using 80 $\mu$m cuts and ¼ shift interdigitation. The present invention allows for the production of two-dimensional composites, composite transducers, transducer arrays and the like of arbitrary and predetermined volume ratio and fine pitch.

Referring to FIGS. 1A–1D, a method for fabricating a first interdigitated piezoelectric composite slab 20 is shown. In one example, the fabrication process begins with a pair of conventional piezoelectric base slabs 10. Depending on the desired application, the base slab made is formed from any desired material having the appropriate electrical and acoustical properties. For example, the base slab may be formed from piezoelectric material, electrostrictive material, and the like. Each base slab is complementary to the other, and, as shown, is diced or cut to form first kerfs or first slots of a width K and a depth D. Each base slab 10 has a substantially planar upper surface 11 and has a longitudinal axis. As shown, a first cutting operation is preformed onto the upper surface of each base slab 10 so that a first plurality of longitudinally extending slots 12 of depth D and width K are defined in the planar upper surface of the base slab. Further, a first plurality of longitudinally extending ridges 14 having a width W are defined in the upper surface of each base slab therebetween the respective first slots 12 of the first plurality of slots. Each ridge 14 is spaced from an adjacent ridge by a width K of the first slot. In this example, the width W of each first ridge 14 is less than the distance K between adjacent first ridges 14. The pitch P of each base slab is the width of each first ridge 14 plus the width K between the adjacent first ridges.

Figure 1B:
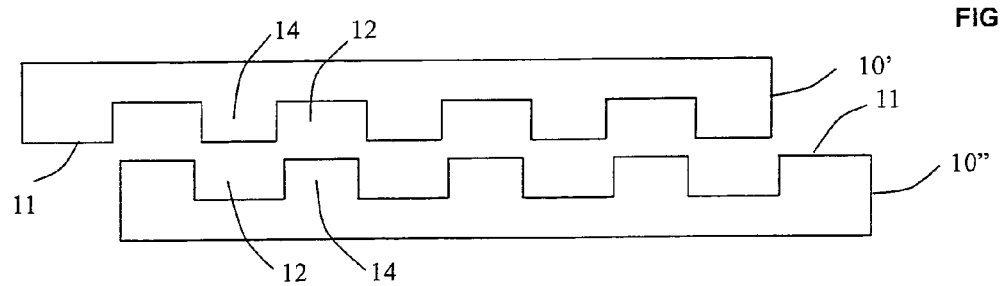
FIG. 1B is a vertical section of a pair of base piezoelectric slabs disposed in overlying registration.
Figure 1C:
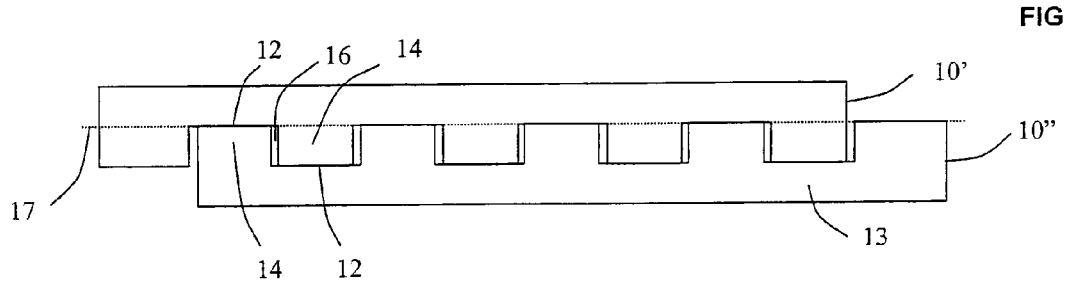
FIG. 1C is a vertical section of the pair of base piezoelectric slabs of FIG. 1B interdigitated in accordance with an embodiment of the present invention.
Figure 1D:
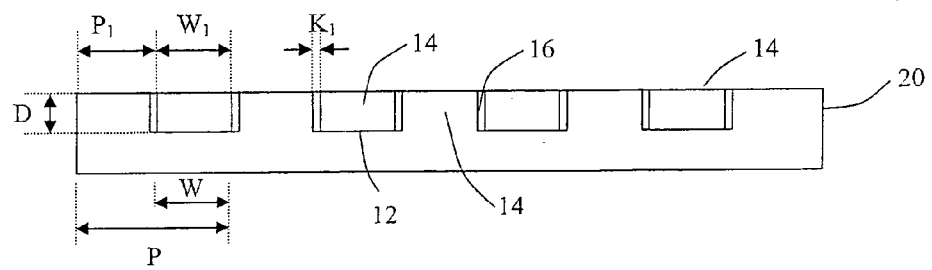
FIG. 1D is a vertical section of a first interdigitated piezoelectric composite slab with a portion of the piezoelectric base slab removed.

FIGS. 1B and 1C show the interdigitating of the diced pair of conventional base slabs 10. The upper surfaces 11 of each of the diced base slabs 10 are placed in overlying interdigitation registration with each other such that the first plurality of ridges 14 of a first base slab 10' is disposed within the first plurality of slots 12 of a second base slab 10". Because the width W of each first ridge 14 is less than the width K between adjoining first ridges 14, one will appreciate that a first gap 16 having width $K_1$ is formed between each of the respective first ridges of the connected first and second base slabs. Thus, in this example, each first ridge of the first base slab is spaced from an adjacent first ridge of the second base slab by the width $K_1$ of the first gap.

The first gaps 16 (and the other gaps referenced herein) may be filled with a filling material. The filling material may comprise, for example, a polymeric material, such as, for example, epoxy, polymer micro-spheres, crystal bond, and the like, as is customary and standard practice in the manufacture of composite transducers, or they may be left, at least in part, unfilled. In one example, the diced slabs may be dry assembled and then the gap filling material may be introduced. In another example, at least one of the diced slabs is prewet and/or their slots filed with such gap filling material. Here, any excess amount of gap filling material can be forcibly displaced as the two diced slabs are brought together and the ridges of the first slab are interdigitated with the ridges of the second slab. In yet another example, at least one of the diced slabs is prewetted and the diced slabs are interdigitated and pulled together through capillary forces and/or atmospheric forces induced by a controlled withdrawal of excess gap filling material. One will appreciate that the gaps may not be completely filled or that they are only filled temporarily as some or the entire gap filling material is removed using conventional methods.

Next, the portion of the base slab 10 that extends above notional line 17 is ground, lapped away or otherwise removed to form a first interdigitated piezoelectric composite slab 20. This exposes a portion of the first ridges 14 of both the first and second base slabs 10 and a portion of the first gaps 16 therebetween. The removal of the gap filling material, if desired, is most easily and conveniently achieved after removal of the piezoelectric material above the notional line 17. As one will appreciate, the first interdigitated piezoelectric composite slab 20 has a pitch $P_1$ that is less than the pitch P of the respective first and second base slabs. In this example, the pitch $P_1$ is the width $W_1$ (here, the width W of the first ridge 14) plus the width $K_1$ of the first gap 16. Thus, the volume ratio of the first interdigitated piezoelectric composite slab 20 is less than the volume ratio of the uncut piezoelectric base slabs.

Figure 2A:
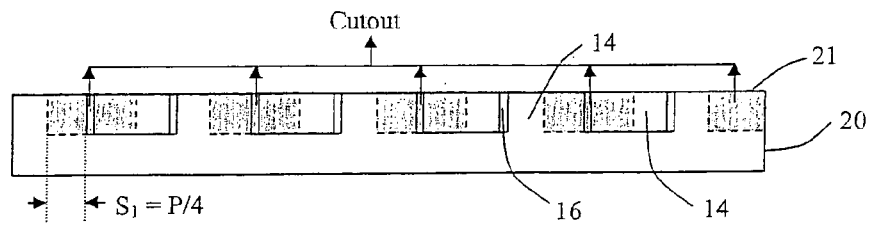
FIG. 2A is a vertical section of one first interdigitated piezoelectric composite slab of FIG. 1D showing portions of the slab to be removed, the portions to be removed shifted a predetermined distance in accordance with an embodiment of the present invention.
Figure 2B:
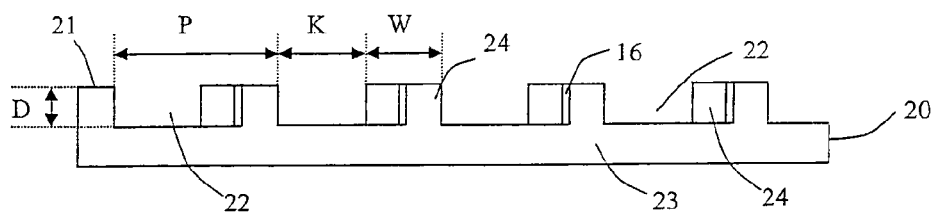
FIG. 2B is a vertical section of one first interdigitated piezoelectric composite slab of FIG. 2A diced in accordance with an embodiment of the present invention.

The present invention provides for multi-interdigitizing to provide for piezoelectric composites having fine kerf sizing. Referring now to FIGS. 2A and 2B, a pair of first interdigitated piezoelectric composite slabs 20 is provided. Each first interdigitated piezoelectric composite slab 20 has a substantially planar upper surface 21 and a longitudinal axis. Each first interdigitated piezoelectric composite slab is complementary to the other, and, as shown, is diced or cut in a shift-dicing step to form second kerfs or second slots of a width K and a depth D. In this aspect, a second cutting operation is performed on the upper surface of each first interdigitated piezoelectric composite slab 20. The second cutting operation is spaced a distance $S_1$ that is a fraction of the pitch P from the original cutting, which, in this example, is ¼ the pitch P. The cutting position in this shift-dicing step is shifted in a width-wise dimension by a distance equal to a portion of the first ridge width. On will appreciate that other fractions of the pitch P are contemplated for the shift distance $S_1$ of the second cutting.

After the second cutting, a second plurality of longitudinally extending slots 22 of depth D and width K are defined in the upper surface 21 of the first interdigitated piezoelectric composite slab 20. Further, a second plurality of longitudinally extending ridges 24 having a width W and spaced by respective second slots 22 of the second plurality of slots 22 are defined in the upper surface of each first interdigitated piezoelectric composite slab 20. Here, the distance $S_1$ that the second cutting is shifted from the first cutting is less than the width of the second ridge. Thus, as one will appreciate, at least one of the second plurality of longitudinally extending ridges 24 includes the first gap 16, which may be filled with the gap filling material.

Because the cutting element has a constant width, each second ridge 24 is spaced from an adjacent second ridge by a width K of the second slot 22. In this example, the width W of each second ridge 24 is less than the width K between adjacent second ridges 12. The pitch P of each diced first interdigitated piezoelectric composite slab is the width of each second ridge 24 plus the width K between the adjacent second ridges.

Figure 2C:
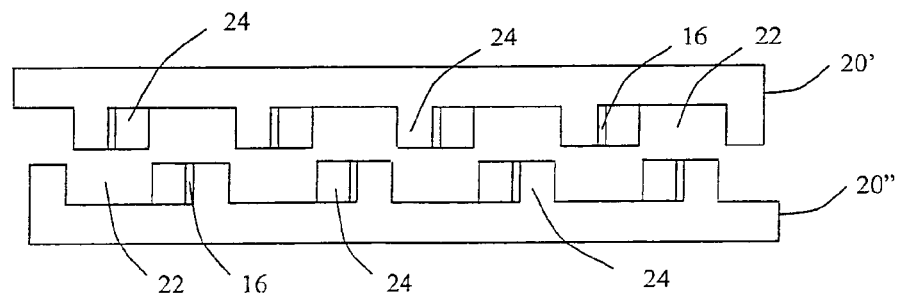
FIG. 2C is a vertical section of a pair of diced first interdigitated piezoelectric composite slabs disposed in overlying registration.
Figure 2D:
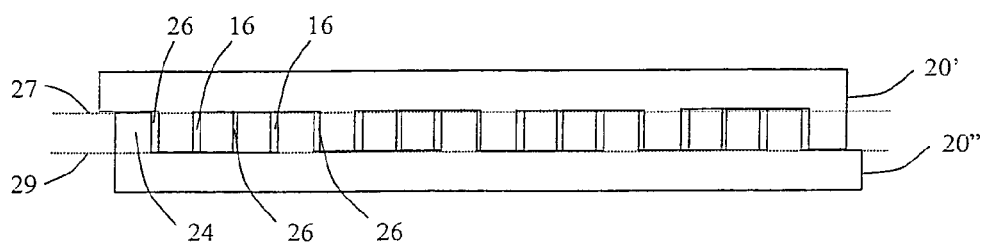
FIG. 2D is a vertical section of the pair of diced first interdigitated piezoelectric composite slabs of FIG. 2C interdigitated in accordance with an embodiment of the present invention.

FIGS. 2C and 2D show the interdigitating of the diced pair of first interdigitated piezoelectric composite slabs. As noted above, the upper surfaces 21 of each of the diced first interdigitated piezoelectric composite slabs are placed in overlying interdigitation registration with each other such that the second plurality of ridges 24 of one diced first interdigitated piezoelectric composite slab is interdigitated with the second plurality of slots of the other diced first interdigitated piezoelectric composite slab. A second gap 26 having a width $K_2$ is formed between each of the respective second ridges of the interdigitated diced first interdigitated piezoelectric composite slabs. The width of each second ridge is less than the width K between adjacent second ridges. In one example, the width $K_2$ of the second gap is substantially equal to the width $K_1$ of the first gap. One will appreciate that the second gaps may be filled with a polymeric material as described above.

Figure 2E:
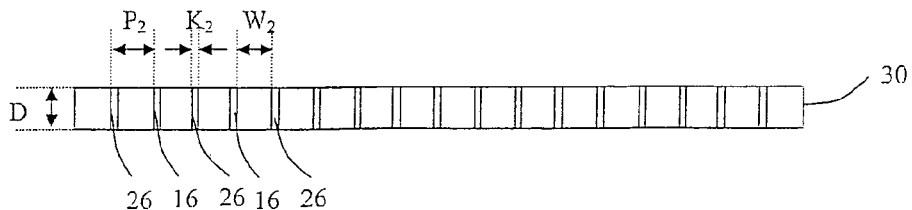
FIG. 2E is a vertical section of a second interdigitated piezoelectric composite slab after grinding processes have been executed on the top and bottom surfaces of the second interdigitated piezoelectric composite slab.

Referring to FIG. 2E, a portion of the diced first interdigitated piezoelectric composite slabs that extends above notional line 27 is ground, lapped away, or otherwise removed to form a second interdigitated piezoelectric composite slab 30. In a further process, a portion of the diced first interdigitated piezoelectric composite slabs that extends below notional line 29 is ground, lapped away, or otherwise removed to form an alternative embodiment of the second interdigitated piezoelectric composite slab 30. As one will appreciate, the second interdigitated piezoelectric composite slab 30 has a pitch $P_2$ that is less than the pitch $P_1$ of the first interdigitated piezoelectric composite slab 20. Thus, even though the same cutting element may be used in the cutting operations, the volume ratio of the second interdigitated piezoelectric composite slab 30 is less than the volume ratio of the first interdigitated piezoelectric composite slab 20. Here, the pitch $P_2$ is greater than second ridge width $W_2$ which is greater than gap width $K_2$.

As shown above, repeated shift dicing of composite slabs can produce piezoelectric composites of varying predetermined volume ratios. As one will appreciate, the cutting operations on the respective diced composite slabs may be shifted as desired to produce interdigitated composite slabs of desired volumetric ratio. In one example, and as shown in FIGS. 3A–4J, the steps of shift dicing and interdigitating can be cycled repeatedly to produce finer pitch piezoelectric composite slabs.

Figure 3A:
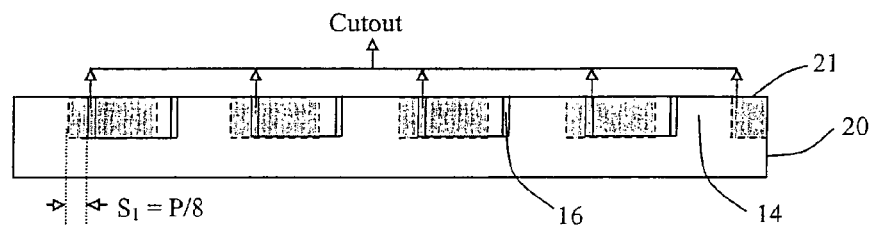
FIG. 3A is a vertical section of one first interdigitated piezoelectric composite slab of FIG. 1D showing portions of the slab to be removed, the portions to be removed shifted a predetermined distance in accordance with an embodiment of the present invention.
Figure 3B:
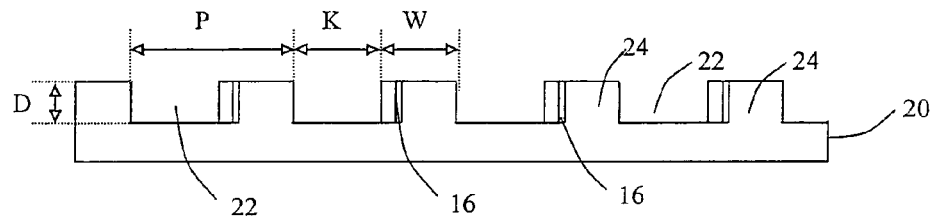
FIG. 3B is a vertical section of one first interdigitated piezoelectric composite slab of FIG. 3A diced in accordance with an embodiment of the present invention.

Referring now to FIGS. 3A and 3B, a pair of first interdigitated piezoelectric composite slabs 20 is provided. Each first interdigitated piezoelectric composite slab is complementary to the other, and, as shown, is diced or cut in a shift-dicing step to form second kerfs or second slots of a width K and a depth D. Each first interdigitated piezoelectric composite slab 20 has a substantially planar upper surface 21. In this aspect, a second cutting operation spaced a distance $S_1$ that is a fraction of the pitch P from the original cutting is performed on the upper surface of each first interdigitated piezoelectric composite slab 20. In this example, the second cutting operation is shifted ⅛ of the pitch P. The cutting position in this shift-dicing step is shifted in a width-wise dimension by a distance equal to a portion of the first ridge width.

After the second cutting operation, a second plurality of longitudinally extending slots 22 of depth D and width K are defined in the upper surface 21 of the diced first interdigitated piezoelectric composite slab 20. Further, a second plurality of longitudinally extending ridges 24 having a width W and spaced by respective second slots 22 of the second plurality of slots 22 are defined in the upper surface of each diced first interdigitated piezoelectric composite slab 20. The distance $S_1$ that the second cutting operation is shifted from the first cutting operation is less than the width of the second ridge. Thus, as one will appreciate and as shown in FIG. 3B, at least one of the second ridges 24 includes the first gap 16, which may be filled with the gap filling material.

Because the cutting element has a constant width, each second ridge 24 is spaced from an adjacent second ridge by a width K of the second slot 22. In this example, the width W of each second ridge 24 is less than the width K between adjacent second ridges 12. The pitch P of each diced first interdigitated piezoelectric composite slab 20 is the width of each second ridge 24 plus the width K between the adjacent second ridges.

Figure 3C:
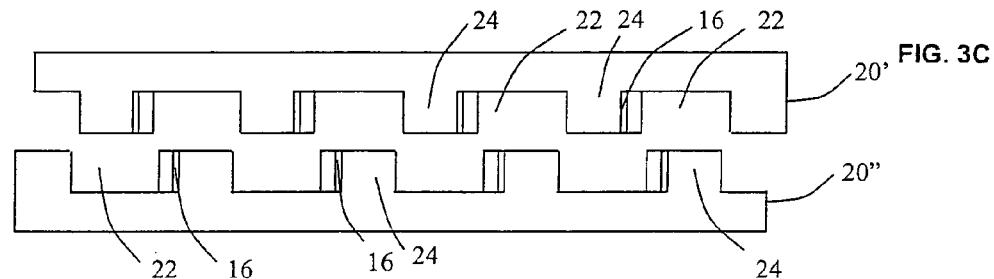
FIG. 3C is a vertical section of a pair of diced first interdigitated piezoelectric composite slabs disposed in overlying registration.
Figure 3D:
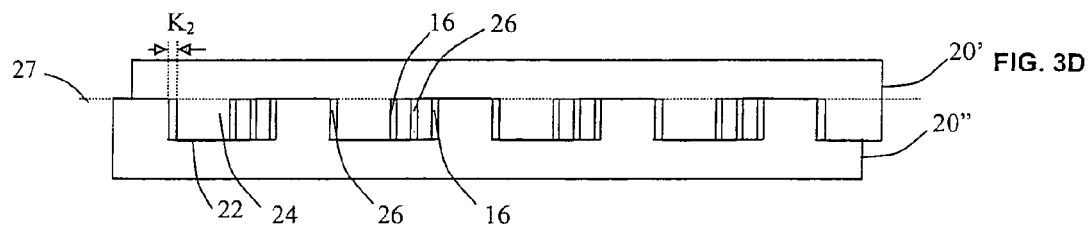
FIG. 3D is a vertical section of the pair of diced first interdigitated piezoelectric composite slabs of FIG. 3C interdigitated in accordance with an embodiment of the present invention.

FIGS. 3C and 3D show the interdigitating of the diced pair of first interdigitated piezoelectric composite slabs. As noted above, the upper surfaces 21 of each of the diced first interdigitated piezoelectric composite slabs are placed in overlying interdigitation registration with each other such the second plurality of ridges 24 of one diced first interdigitated piezoelectric composite slab is interdigitated with the second plurality of slots of the other diced first interdigitated piezoelectric composite slab. A second gap 26 having a width $K_2$ is formed between each of the respective second ridges of the interdigitated diced first interdigitated piezoelectric composite slabs because the width of each second ridge is less than the width K between adjacent second ridges. In one example, width $K_2$ of the second gap is substantially equal to the width $K_1$ of the first gap. One will appreciate that the second gaps may be filled with a polymeric material as described above.

Figure 3E:
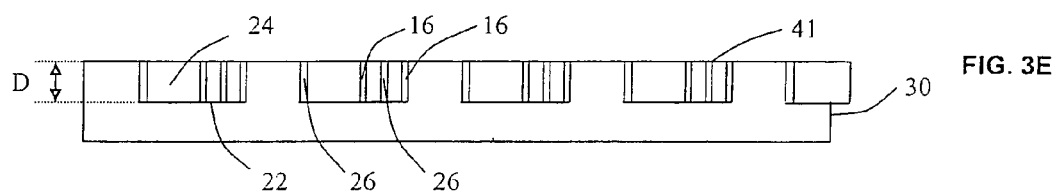
FIG. 3E is a vertical section of an intermediate interdigitated composite slab after grinding the top surface of the intermediate interdigitated composite slab.
Figure 3F:
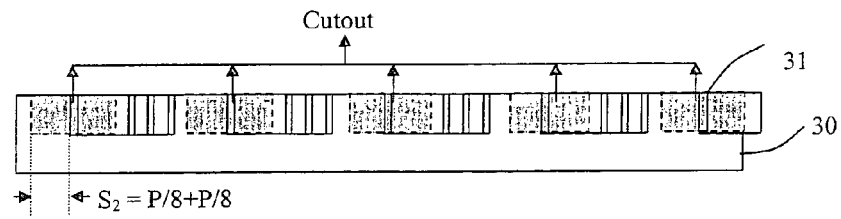
FIG. 3F is a vertical section of one intermediate interdigitated composite slab of FIG. 3E showing portions of the slab to be removed, where the portions to be removed are shifted a predetermined distance in accordance with an embodiment of the present invention.
Figure 3G:
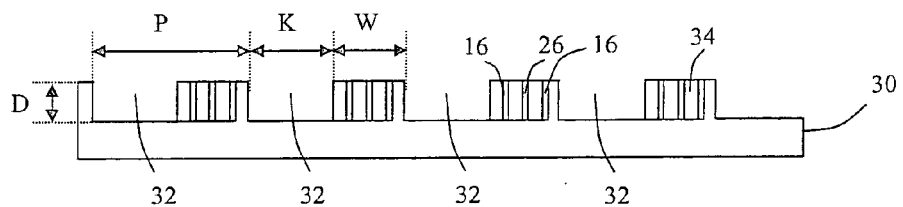
FIG. 3G is a vertical section of one intermediate interdigitated composite slab of FIG. 3F diced in accordance with an embodiment of the present invention.

Referring to FIG. 3E, a portion of the diced first interdigitated piezoelectric composite slabs that extends above notional line 27 is ground, lapped away, or otherwise removed to form an intermediate interdigitated composite slab 30. In the next step, referring now to FIGS. 3F and 3G, a pair of intermediate interdigitated composite slabs 30 is provided. Each intermediate interdigitated composite slab is complementary to the other and has a substantially planar upper surface 31 that is diced or cut in a shift-dicing step to form third kerfs or third slots of a width K and a depth D. In this aspect, a third cutting operation, spaced a distance $S_2$ that is a fraction of the pitch P from the second cutting operation is performed on the upper surface of each intermediate interdigitated composite slab 30. In this example, the third cutting operation is shifted ⅛ of the pitch P from the second operation. The cutting position in this shift-dicing step is shifted in a width-wise dimension by a distance equal to a portion of the second ridge width.

After the third cutting operation, a third plurality of longitudinally extending slots 32 of depth D and width K are defined in the upper surface 31 of the diced intermediate interdigitated composite slab 30. Further, a third plurality of longitudinally extending ridges 34 having a width W and spaced by respective third slots 32 of the third plurality of slots 32 are defined in the upper surface of each diced intermediate interdigitated composite slab 30. The distance $S_2$ that the third cutting is shifted from the second cutting is less than the width of the third ridge. Thus, as one will appreciate, at least one of the longitudinally extending third ridges 34 includes the first gap 16 and the second gap 26, which may be filled with the gap filling material.

Because the cutting element has a constant width, each third ridge 34 is spaced from an adjacent third ridge by a width K of the third slot 32. In this example, the width W of each third ridge 34 is less than the width K between adjacent third ridges 34. The pitch P of each diced intermediate interdigitated composite slab is the width W of each third ridge 34 plus the width K between the adjacent third ridges.

Figure 3H:
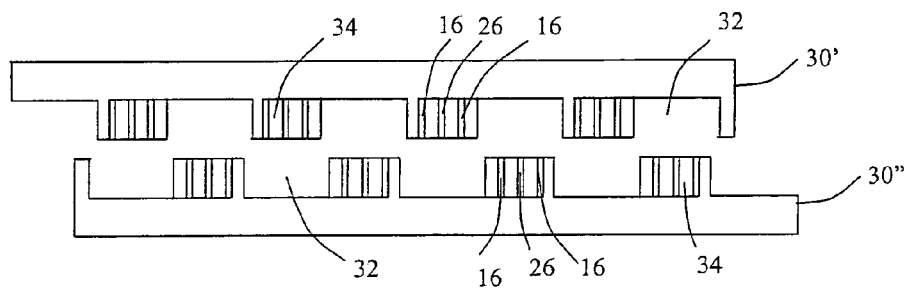
FIG. 3H is a vertical section of a pair of diced intermediate interdigitated piezoelectric composite slabs disposed in overlying registration.
Figure 3I:
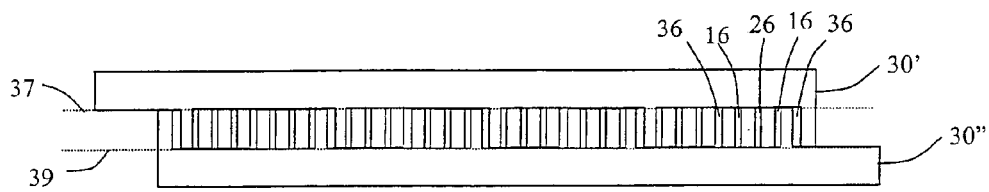
FIG. 3I is a vertical section of the pair of diced intermediate interdigitated composite slabs of FIG. 3H interdigitated in accordance with an embodiment of the present invention.

FIGS. 3H and 3I show the interdigitating of the diced pair of intermediate interdigitated composite slabs 30. As noted above, the upper surfaces 31 of each of the diced intermediate interdigitated composite slabs are placed in overlying interdigitation registration with each other such that the third plurality of ridges 34 of one diced intermediate interdigitated composite slab 30' is interdigitated with the third plurality of slots of the other diced intermediate interdigitated composite slab 30". A third gap 36 having a width $K_3$ is formed between each of the respective third ridges of the interdigitated diced intermediate composite slabs 30 because the width of each third ridge is less than the width K between adjacent third ridges. In one example, the width $K_3$ of the third gap and width $K_2$ of the second gap are substantially equal to the width $K_1$ of the first gap. One will appreciate that the third gaps may be filled with a polymeric material as described above.

Figure 3J:
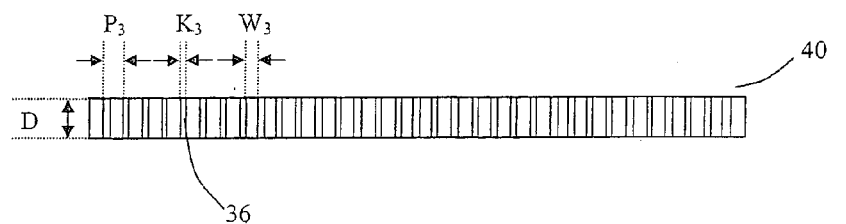
FIG. 3J is a vertical section of a third interdigitated piezoelectric composite slab after grinding the top and bottom surfaces of the third interdigitated piezoelectric composite slab.
Figure 4A:
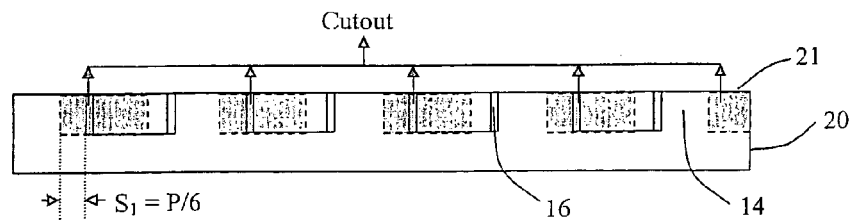
FIG. 4A is a vertical section of one first interdigitated piezoelectric composite slab of FIG. 1D showing portions of the slab to be removed, where the portions to be removed are shifted a predetermined distance in accordance with an embodiment of the present invention.
Figure 4B:
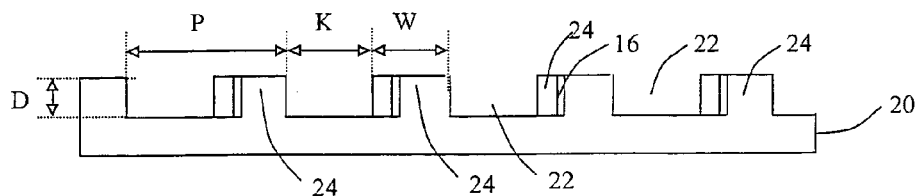
FIG. 4B is a vertical section of one first interdigitated piezoelectric composite slab of FIG. 4A diced in accordance with an embodiment of the present invention.
Figure 4C:
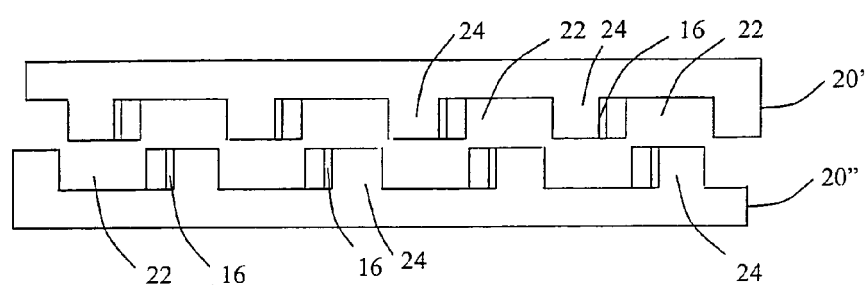
FIG. 4C is a vertical section of a pair of diced first interdigitated piezoelectric composite slabs disposed in overlying registration.
Figure 4D:
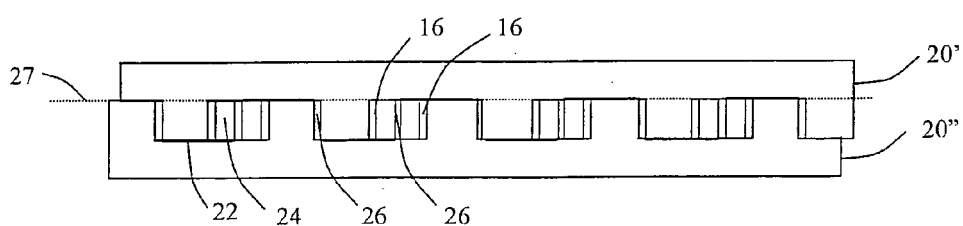
FIG. 4D is a vertical section of the pair of diced first interdigitated piezoelectric composite slabs of FIG. 4C interdigitated in accordance with an embodiment of the present invention.
Figure 4E:
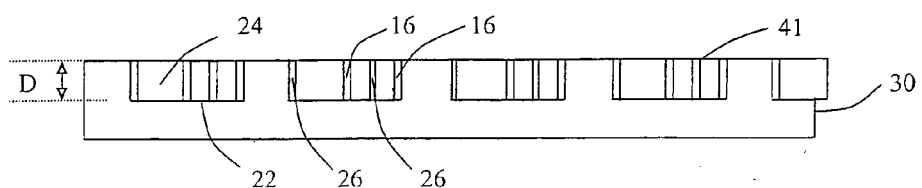
FIG. 4E is a vertical section of an intermediate interdigitated composite slab after grinding the top surface of the intermediate interdigitated composite slab.
Figure 4F:
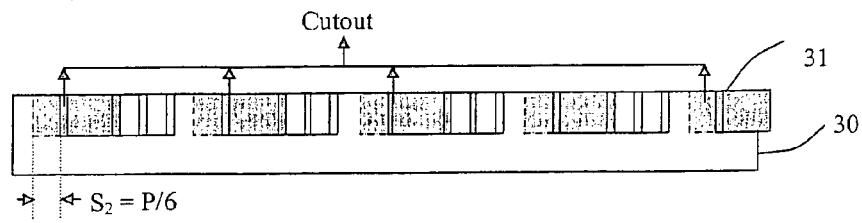
FIG. 4F is a vertical section of one intermediate interdigitated composite slab of FIG. 4E showing portions of the slab to be removed, where the portions to be removed are shifted a predetermined distance in accordance with an embodiment of the present invention.
Figure 4G:
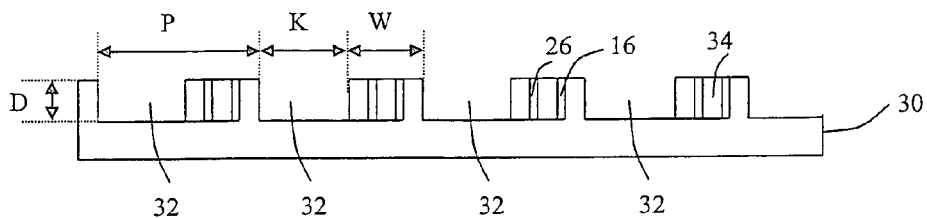
FIG. 4G is a vertical section of one intermediate interdigitated composite slab of FIG. 4F diced in accordance with an embodiment of the present invention.
Figure 4H:
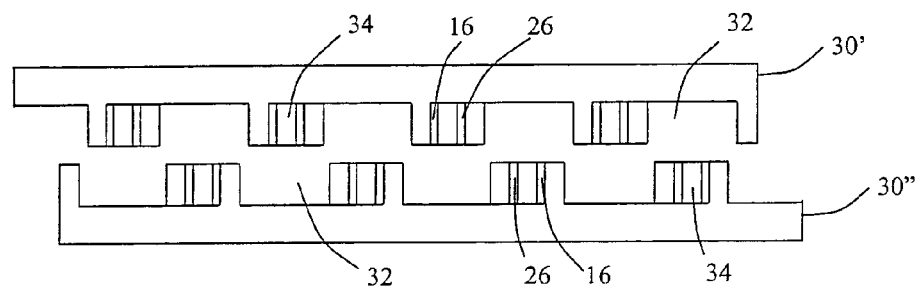
FIG. 4H is a vertical section of a pair of diced intermediate interdigitated composite slabs disposed in overlying registration.
Figure 4I:
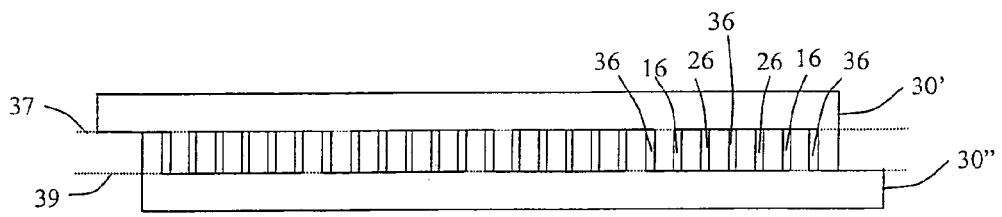
FIG. 4I is a vertical section of the pair of diced intermediate interdigitated piezoelectric composite slabs of FIG. 4H interdigitated in accordance with an embodiment of the present invention.
Figure 4J:
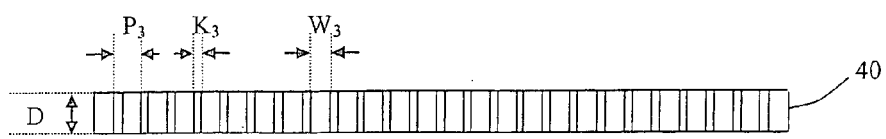
FIG. 4J is a vertical section of a third interdigitated piezoelectric composite slab after grinding the top and bottom surfaces of the third interdigitated piezoelectric composite slab.

Referring to FIG. 3J, a portion of the diced intermediate interdigitated composite slab that extends above notional line 37 is ground, lapped away, or otherwise removed, to form a third interdigitated piezoelectric composite slab 40. In a further process, a portion of the diced intermediate interdigitated composite slab that extends below notional line 39 is ground, lapped away, or otherwise removed, to form an alternative embodiment of the third interdigitated piezoelectric composite slab 40. As one will appreciate, the third interdigitated piezoelectric composite slab 40 has a pitch $P_3$ that is less than the pitch $P_2$ of the respective second interdigitated piezoelectric composite slab. Thus, the volume ratio of the third interdigitated piezoelectric composite slab 40 is less than the volume ratio of the second or first interdigitated piezoelectric composite slabs.

FIGS. 4A–4J illustrates another example of cycled multidigitation. Here, the second cutting operation is shifted a distance $S_1$ that is approximately ⅙ of the pitch P and the intermediate interdigitated composite slab is formed as outlined above. A third cutting operation is made on the upper surface of the intermediate interdigitated composite slab 30. The third cutting is shifted a distance $S_2$ that is approximately ⅙ of the pitch P. The diced intermediate interdigitated composite slabs are then interdigited and the portions of the uncut piezoelectric material are removed to form the third interdigitated piezoelectric composite slab 40.

One will appreciate that successive cycles of shift-dicing and interdigitation may be performed to provide for interdigitated piezoelectric composite slabs of successively finer kerf size. Thus, the present invention provides a method for producing piezoelectric composite slabs having a desired volume ratio. Thus, it will be recognized that a method for making a piezoelectric composite with extremely fine pitch for high frequency application has been provided. The method uses shift cutting and multi-interdigitating.

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of making a piezoelectric composite, comprising:

providing a pair of base slabs, each base slab having a substantially planar upper surface;

forming a pair of diced base slabs by dicing the upper surface of each base slab to define a first plurality of longitudinally extending slots therein and a first plurality of longitudinally extending ridges, wherein each first slot has a depth D and width K, wherein each first ridge has a width W, wherein the width W of the first ridge is less than the width K of the first slot, and wherein each adjoining first slot and first ridge has a pitch P equal to the sum of the width W and the width K;

positioning the pair of diced base slabs in overlying interdigitation registration with each other such that the first plurality of ridges of one diced base slab is disposed within the first plurality of slots of the other diced base slab;

connecting the pair of diced base slabs so that a plurality of first gaps is defined, each first gap formed between each of the respective first ridges of the connected pair of diced base slabs;

removing a portion of one diced base slab to form a first interdigitated piezoelectric composite slab, the first interdigitated piezoelectric composite slab having a substantially planar upper surface formed from portions of the first ridges of the connected pair of diced base slabs and from portions of the plurality of first gaps;

providing a pair of the first interdigitated piezoelectric composite slabs;

forming a pair of diced first interdigitated piezoelectric composite slabs by dicing the upper surface of each first interdigitated piezoelectric composite slab to define a second plurality of longitudinally extending slots therein the upper surface of the first interdigitated piezoelectric composite slab and a second plurality of longitudinally extending ridges, wherein each second slot has a depth D and width K, wherein each second ridge has a width W, wherein the width W of the second ridge is less than the width K of the second slot, and wherein the second slot is spaced a distance shift $S_1$ from an edge of a first ridge, the shift distance $S_1$ being a fraction of the pitch P;

positioning the pair of diced first interdigitated piezoelectric composite slabs in overlying interdigitation registration with each other such that the second plurality of ridges of one diced first interdigitated piezoelectric composite slab is disposed within the second plurality of slots of the other diced first interdigitated piezoelectric composite slab;

connecting the pair of diced first interdigitated piezoelectric composite slabs so that a plurality of second gaps is defined, each second gap formed between each of the respective second ridges of the connected pair of diced first interdigitated piezoelectric composite slabs;

removing a portion of one diced first interdigitated piezoelectric composite slab to form an intermediate interdigitated composite slab, the intermediate interdigitated composite slab having an upper surface;

providing a pair of intermediate interdigitated composite slabs;

forming a pair of diced intermediate interdigitated composite slabs by dicing the upper surface of each intermediate interdigitated composite slab to define a third plurality of longitudinally extending slots therein the upper surface of the intermediate interdigitated composite slab and a third plurality of longitudinally extending ridges, wherein each third slot has a depth D and width K, wherein each third ridge has a width W, wherein the width W of the third ridge is less than the width K of the third slot, and wherein the third slot is spaced a shift distance $S_2$ from a portion of a second ridge such that the third slot is spaced from the second slot, the shift distance $S_2$ being a fraction of the pitch P;

positioning the pair of diced intermediate interdigitated composite slabs in overlying interdigitation registration with each other such that the third plurality of ridges of one diced intermediate interdigitated composite slab is disposed within the third plurality of slots of the other diced intermediate interdigitated composite slab;

connecting the pair of diced intermediate interdigitated composite slabs so that a plurality of third gaps is defined, each third gap formed between each of the respective second ridges of the connected pair of diced intermediate interdigitated piezoelectric composite slabs; and removing a portion of one diced intermediate interdigitated composite slab to form a third interdigitated piezoelectric composite slab, the third interdigitated piezoelectric composite slab having a volume ratio that is less than the volume ratio of the first and intermediate interdigitated piezoelectric composite slabs.

2. The method of claim 1, wherein the first gap, the second gap, and the third gap are approximately the same size.

3. The method of claim 1, wherein the dicing steps are accomplished using any combination of mechanical abrasive sawing, laser cutting, ultrasonic cutting, electrodischarge machining, wet etching, and dry etching.

4. The method of claim 1, further comprising the step of prewetting at least one of the diced base slabs with a settable polymeric material prior to interdigitation, the polymeric material bonding the pair of diced base slabs upon subsequent interdigitation.

5. The method of claim 4, wherein the polymeric material substantially fills the first gap.

6. The method of claim 4, further comprising the step of prewetting at least one of the diced first interdigitated piezoelectric composite slabs with a settable polymeric material prior to interdigitation, the polymeric material bonding the pair of diced first interdigitated piezoelectric composite slabs upon subsequent interdigitation.

7. The method of claim 6, wherein the polymeric material substantially fills the second gaps.

8. The method of claim 1, further comprising the step of prewetting at least one of the diced intermediate interdigitated composite slabs with a settable polymeric material prior to interdigitation, the polymeric material bonding the pair of diced intermediate interdigitated composite slabs upon subsequent interdigitation.

9. The method of claim 8, wherein the polymeric material substantially fills the third gaps.

10. The method of claim 1, wherein the each diced base slab, each diced first interdigitated piezoelectric composite slab, and each diced intermediate interdigitated composite slab are diced such that P>K>W.

11. The method of claim 1, wherein the shift distance $S_1$ is substantially equal to ⅛P.

12. The method of claim 11, wherein the shift distance $S_2$ is substantially equal to ⅛P.

13. The method of claim 1, wherein the shift distance $S_1$ is substantially equal to ⅙P.

14. The method of claim 13, wherein the shift distance $S_2$ is substantially equal to ⅙P.

15. The method of claim 1, wherein the first gap is approximately the same size as the second gap.

16. The method of claim 1, wherein the shift distance $S_1$ is substantially equal to ¼P.

* * * * *